(12) United States Patent
Ahn et al.

(10) Patent No.: US 9,374,890 B2
(45) Date of Patent: Jun. 21, 2016

(54) CHIP SUBSTRATE HAVING A LENS INSERT

(71) Applicant: Point Engineering Co., Ltd., Asan-si, Chungcheongnam-do (KR)

(72) Inventors: Bum Mo Ahn, Yongin-si (KR); Ki Myung Nam, Cheonan-si (KR); Young Chul Jun, Ansan-si (KR)

(73) Assignee: Point Engineering Co., Ltd., Asan-si (KR)

( * ) Notice: Subject to any disclaimer, the term of this patent is extended or adjusted under 35 U.S.C. 154(b) by 0 days.

(21) Appl. No.: 14/546,201

(22) Filed: Nov. 18, 2014

(65) Prior Publication Data

US 2015/0138656 A1    May 21, 2015

(30) Foreign Application Priority Data

Nov. 20, 2013  (KR) .................. 10-2013-0141256

(51) Int. Cl.
*G02B 7/02* (2006.01)
*G02B 3/00* (2006.01)
*H05K 1/02* (2006.01)

(52) U.S. Cl.
CPC ............. *H05K 1/0274* (2013.01); *G02B 7/02* (2013.01); *H05K 2201/10106* (2013.01); *H05K 2201/10121* (2013.01)

(58) Field of Classification Search
USPC ........................................ 359/811–830, 642
See application file for complete search history.

(56) References Cited

U.S. PATENT DOCUMENTS

| 5,615,052 A   | *  | 3/1997 | Doggett ............... G01N 21/274 |
|               |    |        | 359/642 |
| 8,390,083 B2  |    | 3/2013 | O'Donnell et al. ........... 257/414 |
| 2010/0155769 A1 | * | 6/2010 | Lin ....................... H01L 21/486 |
|               |    |        | 257/99 |
| 2011/0180893 A1 | * | 7/2011 | Minegishi ......... H01L 27/14618 |
|               |    |        | 257/432 |
| 2014/0203451 A1 | * | 7/2014 | Kwon ................... H01L 23/481 |
|               |    |        | 257/774 |

FOREIGN PATENT DOCUMENTS

| KR | 2006-0114526 A | 11/2006 | ............. H01L 33/00 |
| KR | 10-0867516     | 11/2008 | ............. H01L 33/00 |
| KR | 2009-0075354 A | 7/2009  | ............. H05K 1/18 |
| KR | 10-0986211     | 10/2010 | ............. H05K 1/18 |

\* cited by examiner

*Primary Examiner* — Mohammed Hasan
(74) *Attorney, Agent, or Firm* — Sunstein Kann Murphy & Timbers LLP

(57) ABSTRACT

A chip substrate includes: a conductive layer being stacked in one direction and constituting a chip substrate; an insulator being alternately stacked with the conductive layer and electrically separating the conductive layer; and a lens insert having: a depression reaching down to a predetermined depth from a specified area of an upper surface of the chip substrate overlapping with the insulator; and a predetermined number of sides on the upper surface wherein arcs are formed at regions where the sides are met with each other. Since the space for inserting a lens can be formed to have a shape comprising straight lines, and a lens to be inserted can also be manufactured in a shape comprising straight lines, therefore the manufacturing process for a lens to be inserted into the chip substrate can be further simplified.

7 Claims, 6 Drawing Sheets

CHIP SUBSTRATE HAVING A LENS INSERT

Priority is claimed from Korean Patent Application No. 10-2-13-0141256, the full disclosure of which is hereby incorporated by reference herein.

BACKGROUND

1. Technical Field

The present invention relates to a chip substrate and a method for manufacturing thereof, more particularly to a chip substrate having a lens insert.

2. Description of the Related Art

Conventionally, for a chip mounting on a chip substrate, a space has been produced on the upper surface of the chip substrate by using mechanical machining or chemical etching. In other words, a manufacturing method using the process of forming a mounting space by etching the upper portion of an unprocessed rectangular shaped metal substrate has been disclosed in Korean Patent Registration Gazette as a Korean Pat. No. 0986211.

Further, for mounting an optical device such as a UV device or an LED, a space having a downwardly narrowing taper has been formed for enhancing optical reflection capability. After forming such a space, a chip is mounted, and when sealing the mounting space, a lens was formed, thereby increasing the optical efficiency.

At this time, in forming a lens, since the produced space for mounting forms a circular shape when viewed from the top of the chip substrate, accordingly the shape of the lens was formed to be a circular shape corresponding thereto.

However, there have been difficulties in manufacturing process for precision machining of the lens into a circular form compare with machining of the lens comprising straight lines in a rectangle or a triangle.

SUMMARY

A chip substrate structure of an embodiment of the invention includes a mounting space for inserting a lens formed with a shape including straight lines. More particularly, the space for insertion of the lens may be formed to have a shape including straight lines by separating the chip mounting space and the lens insertion space, and a chip mounting space is further formed inside of the lens insertion space.

According to an aspect of the present invention, there is provided a chip substrate including:

a conductive layer being stacked in one direction and constituting a chip substrate;

an insulator being alternately stacked with the conductive layer and electrically separating the conductive layer; and a lens insert having: a depression reaching down to a predetermined depth from a specified area of an upper surface of the chip substrate overlapping with the insulator; and a predetermined number of sides on the upper surface wherein arcs are formed at regions where the sides are met with each other It is preferable that the arcs of the lens insert protrude outwardly from a region defined by extended lines of the sides.

It is preferable that the chip substrate further includes a cavity reaching down to a predetermined depth from an inner area of the lens insert overlapping with the insulator.

It is preferable that the cavity have a downwardly narrowing shape wherein a size of a cross-section thereof becomes smaller as a depth of the cavity becomes deeper.

It is preferable that the lens insert further includes additional arcs protruding outwardly from the sides on the upper surface of the chip substrate.

It is preferable that the predetermined number is four, and the arcs are formed at the four regions where the sides are met with each other.

It is preferable that the chip substrate further includes an electrode marker at the upper surface of the chip substrate for marking an electrode for at least one of the conductive layers separated by the insulators.

It is preferable that the lens insert further have a slot reaching down to a predetermined depth in a surface contacting a lens when inserting the lens.

Since the space for inserting a lens can be formed to have a shape comprising straight lines, and a lens to be inserted can also be manufactured in a shape comprising straight lines, therefore the manufacturing process for a lens to be inserted into the chip substrate can be further simplified.

DETAILED DESCRIPTION OF EMBODIMENTS

The above described objectives, features, and advantages will be more apparent through the following detailed description related to the accompanying drawings, and thus those of ordinary skill in the art may easily implement the technical spirit of the invention. For convenience's sake, an LED chip will be described as an example.

For manufacturing a chip substrate according to an exemplary embodiment of the present invention, a plurality of conductive layers, containing conductive material and having a predetermined thickness, are bonded and alternately stacked with the insulating layers (which are insulators) comprising insulating material and disposed therebetween. In this specification, "insulating layer" is no more than an example of "insulator", and the insulators may have any forms or shapes other than "layers" without departing from the scope of the invention.

By heating and pressurizing while it is stacked, a lump of conductive material wherein a plurality of insulating layers are arranged with a constant gap. Next, by vertically cutting the lump of conductive material, which is produced in this way, to include the insulating layers, manufacturing of a chip substrate wherein a plurality of insulating layers are arranged parallel with a constant gap is completed. In other words, unidirection in an exemplary embodiment of the present invention is a vertical direction, and a chip substrate is manufactured by vertically cutting the lump of conductive material along the direction of stacking.

By forming a lens insert and a cavity in a chip substrate manufactured by cutting thereof according to the above described method, a chip substrate comprising a lens insert according to an exemplary embodiment of the present invention is manufactured.

Figure 2:
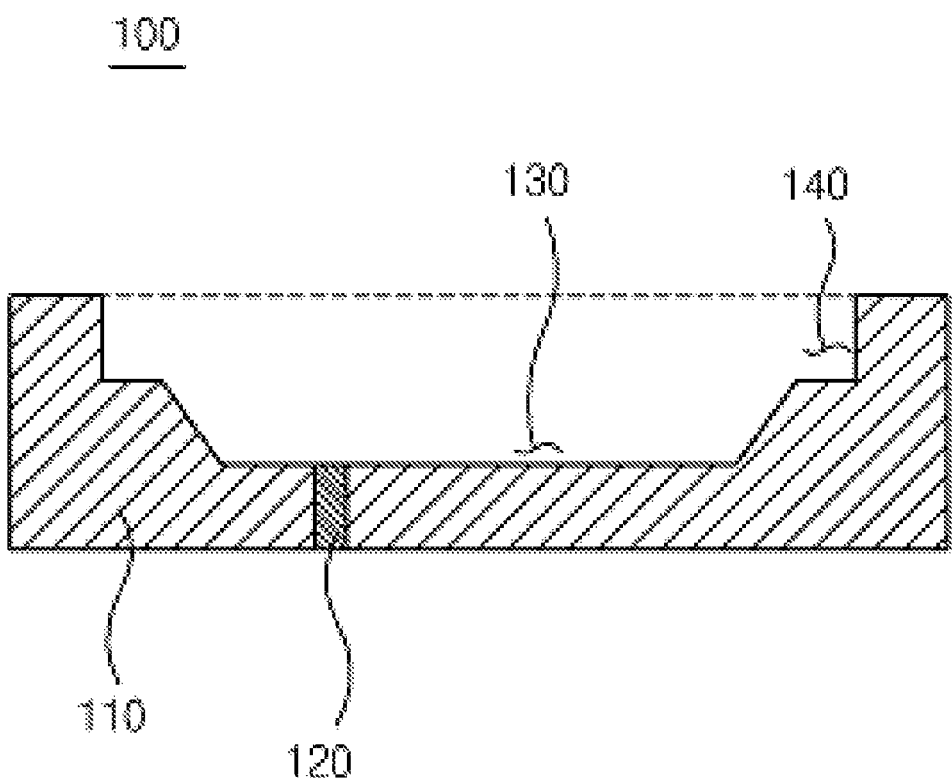
FIG. 2 is a cross-sectional view of a chip substrate comprising a lens insert according to an exemplary embodiment of the present invention.
Figure 3:
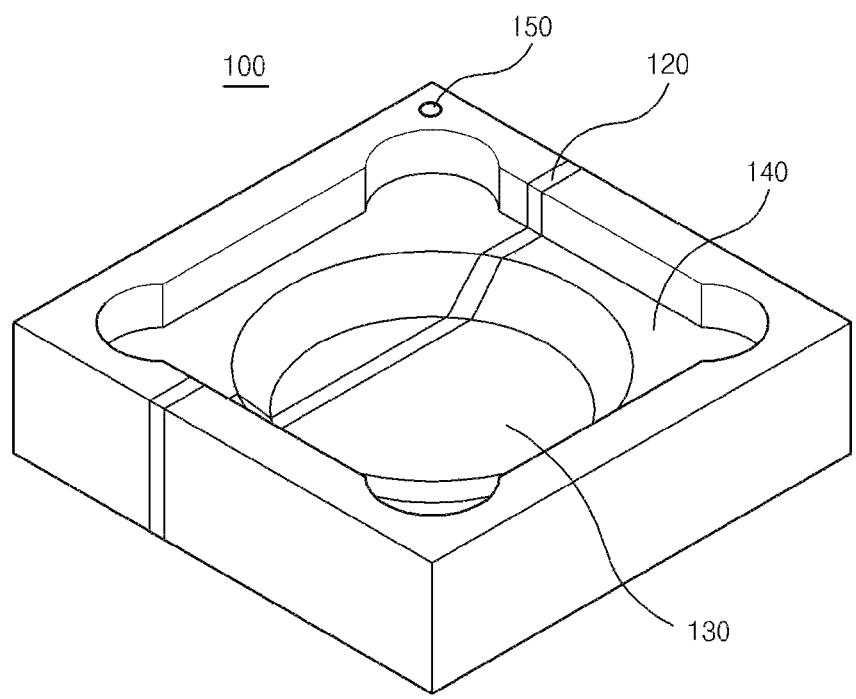
FIG. 3 is a perspective view of a chip substrate comprising a lens insert according to an exemplary embodiment of the present invention.
Figure 5:
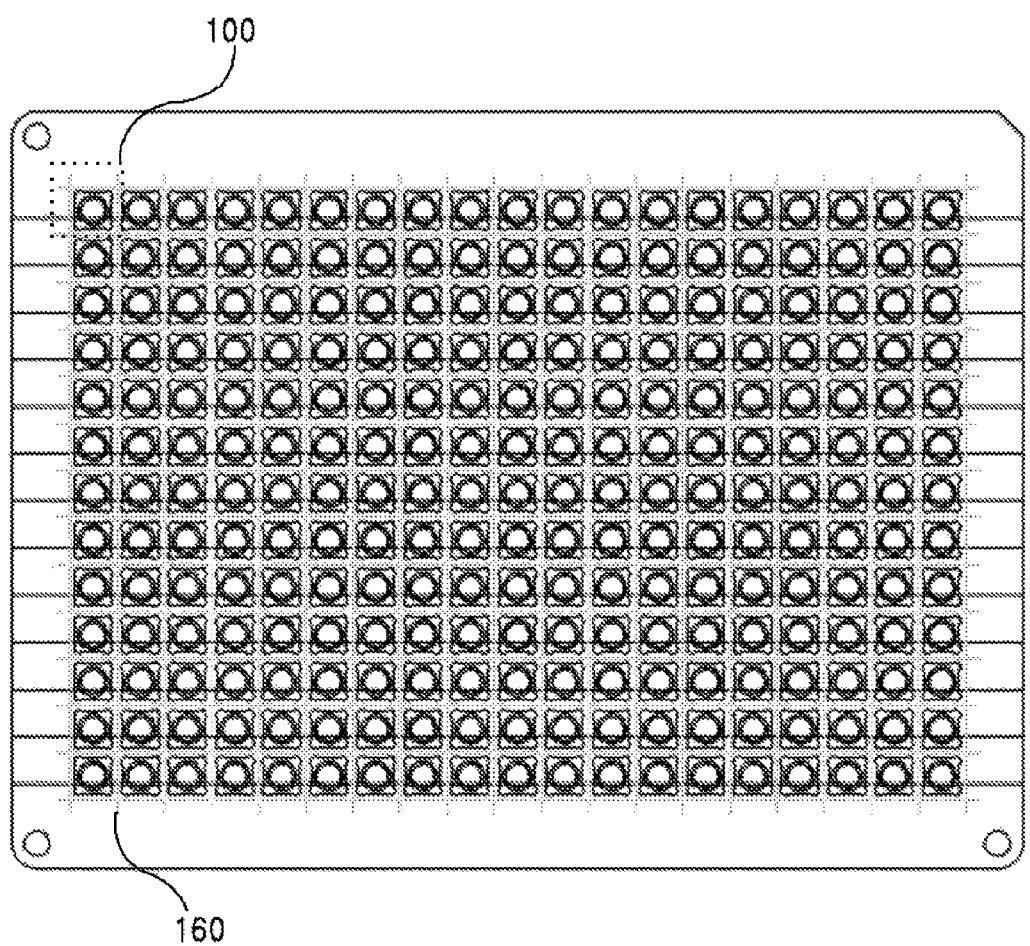
FIG. 5 is a top view of a chip substrate comprising multiple lens inserts according to an exemplary embodiment of the present invention.

In this exemplary embodiment, a chip substrate has a shape as shown in FIG. 5, and a plurality of lens inserts and cavities may be formed on the upper surface of the chip substrate. However, for more detailed description, a chip substrate comprising one lens insert or one cavity will be described as an example. In other words, the chip substrate shown in FIGS. 1-3 is one of the unit chip substrates, and it can be manufactured by cutting the chip substrate shown in FIG. 5 in lens insert unit.

Hereinafter, with reference to FIG. 1, a chip substrate comprising a lens insert according to an exemplary embodiment of the present invention will be described.

Figure 1:
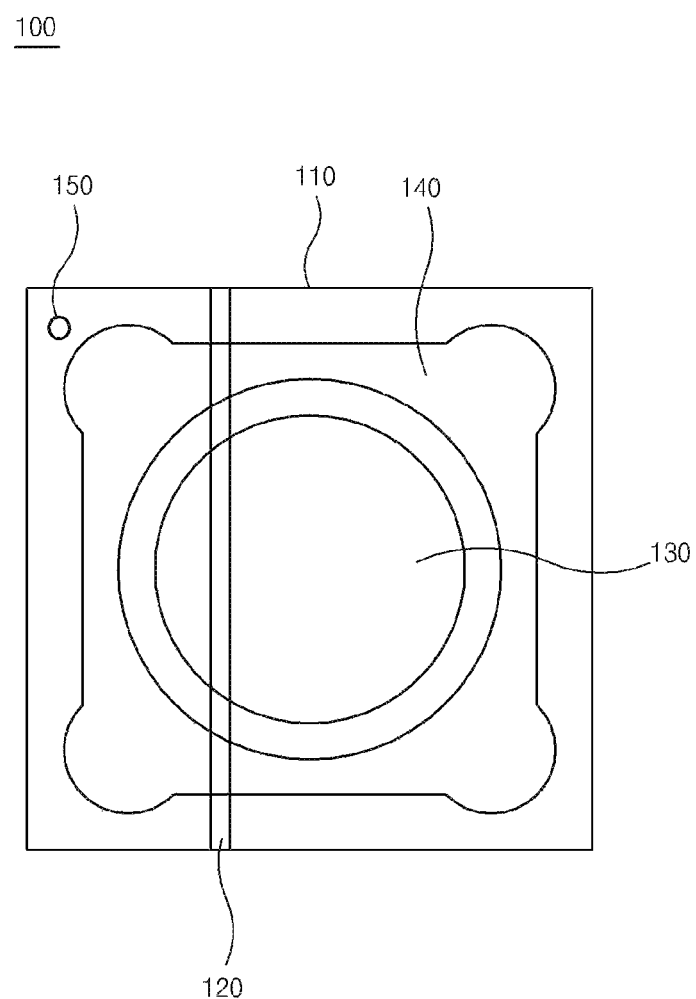
FIG. 1 is a top view of a chip substrate comprising a lens insert according to an exemplary embodiment of the present invention.

FIG. 1 is a top view of a chip substrate 100 comprising a lens insert 140 according to an exemplary embodiment of the present invention. According to FIG. 1, a chip substrate 100 comprising a lens insert 140 according to an exemplary embodiment of the present invention includes: a conductive layer 110, an insulating layer 120, a lens insert 140, and a cavity 130. In other words, if the chip substrate 100 is seen from above, a lens insert 140 is inwardly formed within the rectangular shaped chip substrate 100, and a cavity 130 is formed inside of the lens insert 140. At this time the lens insert 140 and the cavity 130 is formed accommodating the insulating layer 120.

In this exemplary embodiment, the conductive layers 110 constitutes the chip substrate 100 by unidirectionally stacking thereof, and functions as an electrode for applying power to the chip which is mounted by the post processes. Here, unidirection is being defined as the stacking direction of the conductive layers 110 which are alternately stacked with the insulating layers 120 in the stacking step as described above, and according to FIG. 1, it is defined as it is stacked along the horizontal direction.

The insulating layers 120 are alternately stacked with the conductive layers 110 and electrically separate the conductive layers 110. In other words, the insulated chip substrates with the insulating layers 120 interposed therebetween may function as a positive (+) electrode terminal and a negative (−) electrode terminal respectively.

In this exemplary embodiment, although an example wherein one insulating layer 120 is existing between the two conductive layers 110 is described, structuring a chip substrate 100 wherein two insulating layers 120 is formed among three conductive layers 110 is also feasible; forming more insulating layers 120 is also possible depending upon the application thereof.

A lens insert 140 has: a depression reaching down to a predetermined depth from a specified area of an upper surface of the chip substrate 100 overlapping with the insulating layer 120; and a predetermined number of sides on the upper surface wherein arcs are formed at regions where the sides are met with each other.

In other words, as shown in FIG. 1, on the upper surface of a chip substrate formed by sequentially stacking a conductive layer 110 and an insulating layer 120 and another conductive layer 110 towards horizontal direction, a depression is formed covering the region accommodating the insulating layer 120. More specifically, in this exemplary embodiment, the shape of a lens insert 140 has four sides, and the arcs are formed at the 4 corners where the individual sides are met. In other words, the depression has the sides, and each of the sides is parallel to its corresponding side of the chip substrate 100 as shown in FIG. 1.

At this time, in this exemplary embodiment, it is preferred that the corners are formed into an arc-form. When using a cutting machine based on a rotational motion such as a milling machine in a manufacturing process for making the depression in the chip substrate 100 in order to form a lens insert 140, making a depression having a cross-section with a right-angle corner is difficult. To solve this problem, the process may include the following steps: forming a side is by a linear motion; and forming a next side by letting the cutting machine move to the next side along the arc having a predetermined curvature. In this manner, the depression can be more easily formed by a continuous process.

Further, in this exemplary embodiment as illustrated in FIG. 1, it is preferred that the arcs are formed outwardly protruded from the regions defined by the extended lines of the sides. The shape of the lens insert 140 is for securing the space for lens insertion and for fixing the inserted lens. In this exemplary embodiment, in order to solve the difficulties in a conventional circular lens manufacturing process, the arcs in this exemplary embodiment are preferred to be formed in the outer areas from the right-angled corners of the lens.

If the arcs are inwardly formed from the extended lines of the sides, the corners of the lens to be inserted must be machined in accordance with the curvature of the arc. However, if the arcs are outwardly formed from the extended line of the sides as in this embodiment, even a lens with right-angled corners can be easily accommodated, and the lens can be fixed using the sides. Further, the gap between the arcs and the lens after insertion of the lens can be sealed via post processing, thus the insertion of the lens can be completed.

In this exemplary embodiment, in order to accommodate a rectangular lens a lens insert 140 having four sides is described, however, the number of sides may be different depending upon the usage and the shape of the lens, and, the arcs may be formed in some selected areas not in every areas where the sides are met, and corners may be formed in the remaining areas where the sides are met.

The chip substrate 100 according to an exemplary embodiment of the present invention may further include a cavity 130, which is formed in accordance with the foregoing description, inside of the lens insert 140 covering an area including the insulating layer 120.

Thus, according to FIG. 2, since the depression is formed to have a predetermined depth in the chip substrate 100, a lens insert 140 is formed inward direction, considering this, a cavity 130 is formed in a region which is deeper than the depth of the lens insert 140.

In this exemplary embodiment, preferably, it (cavity) is formed into a downwardly narrowing shape, wherein the width is getting narrower as it travels downward direction. Since the cavity 130 is formed into a downwardly narrowing shape in order to enhance the optical reflectivity of the mounting chip, a diagonally slanted outer wall is formed in the cross-section as shown in FIG. 2.

In addition, in FIGS. 1 and 2, although an example wherein one cavity 130 is formed in one lens insert 140 is shown, forming a plurality of cavities 130 is also possible depending upon the usage of the chip substrate 100. Therefore, forming 4 cavities 130 and 2 insulating layers 120 is also possible according to the configuration as shown in FIG. 4.

Further, a chip substrate 100 comprising a lens insert 140 according to an exemplary embodiment may further include an electrode marker.

According to FIG. 1, as described above, in the chip substrate 100 according to an exemplary embodiment of the present invention, an insulating layer 120 is formed between the two conductive layers 110, therefore, different electrodes may be applied respectively to the conductive layers 110 separated by the insulating layers 120. Accordingly, by marking 150 on the surface of only one conductive layer 110 and pre-setting the polarity, e.g. positive (+), of the conductive layer 110 which is marked, the polarity of the conductive layer 110 can be determined more easily.

Figure 4:
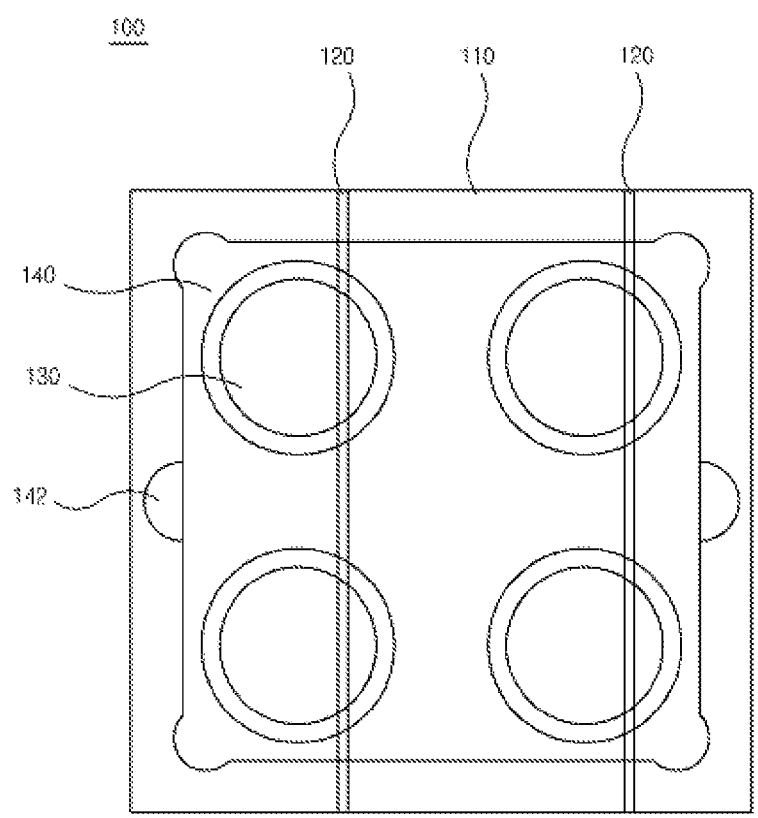
FIG. 4 is a top view of a chip substrate comprising a lens insert according to another exemplary embodiment of the present invention.

Further, according to FIG. 4, a lens insert 140 of a chip substrate 100 comprising a lens insert 140 according to an exemplary embodiment may further include additional arcs 142 which are formed outwardly protruded from the sides on the upper surface of the chip substrate 100. In other words, comparing with FIG. 1, by forming the additional arcs 142 in the two facing sides in addition to the (four) corners, in moving and coupling of a rectangular lens, when a jig or a robot is used instead of a suction method, it can be helpful for a smooth operation of the bonding process or an accurate bonding by providing grooves for the jig in the substrate.

Figure 6:
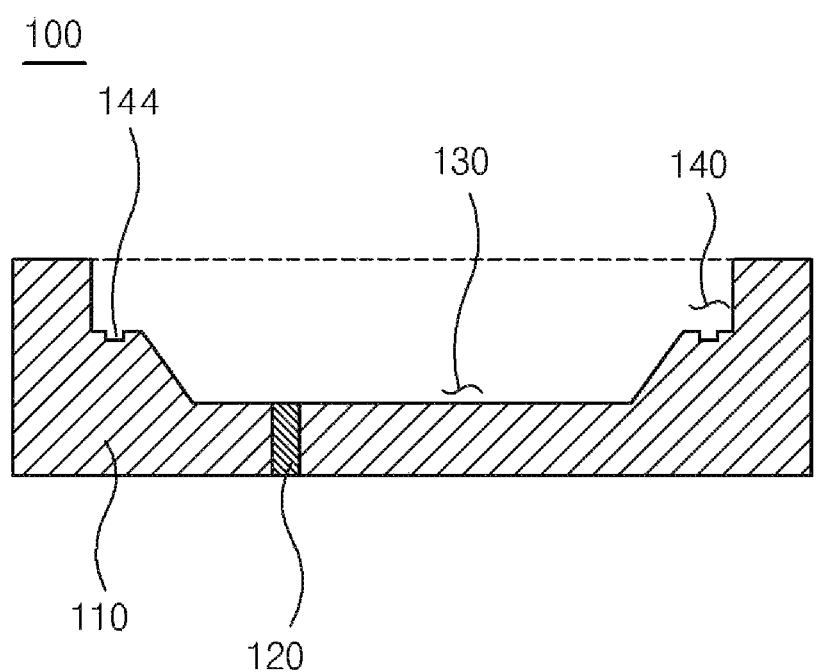
FIG. 6 is a cross-sectional view of a chip substrate comprising a lens insert according to another exemplary embodiment of the present invention.

In addition, according to FIG. 6, a lens insert 140 according to an exemplary embodiment may further include a slot 144 reaching down to a predetermined depth on a surface contacting with the lens when inserting the lens. In other words, in this exemplary embodiment, an adhesive is injected into the space comprising a slot 144 on the contacting area along the circumference of the lens insert 140, and the lens is bonded. Hence, when attaching the lens, the used adhesive may overflow towards inside and outside of the bonding area, a separate slot 144 may be provided on the bonding surface with the lens for preventing this problem (overflow) and for the usage of proper amount of the adhesive.

A chip substrate according to the above exemplary embodiment, as described above, for convenience's sake a unit chip substrate 100 where one lens insert is formed therein as shown in FIG. 3 is described as an example, however, in a chip substrate in this exemplary embodiment, a plurality of lens inserts may be formed thereon as shown in FIG. 5, and individual unit chip substrates, as shown in FIG. 3, can be manufactured by dicing along the dicing guideline 160 which is marked on the surface of the chip substrate.

Above described chip substrate is devised for solving the difficulties in the manufacturing process, wherein the shape of the lens must be formed in a circular shape to fit into the conventional circular chip mounting space; in this exemplary embodiment of the present invention, a lens insert comprising straight lines is formed prior to forming of a circular cavity where the chip is mounted therein, so the lens may be formed into a rectangular shape having straight lines, thereby facilitating the (manufacturing) process.

Further, by forming an arc in the area where the sides of the lens insert are met, in making the depression for the lens insert, the dicing machine can move from side to side more easily, and, separate grooves for the jigs are formed in the sides, thereby more facilitating the lens bonding process.

The above description is merely exemplary. Various modifications, changes, and substitutions are possible for a person of skill in the art within the scope without deviating from the fundamental characteristics of the present invention.

Therefore, the exemplary embodiments and the accompanying drawings disclosed herein are for explanation and not for limiting the technical spirit of the present invention, and the scope of the technical spirit of the present invention is not limited by these exemplary embodiments and the accompanying drawings. The scope of protection of the present invention must be interpreted according to the following claims, and it must be interpreted in such a way that all the technical spirits within the equivalent scope of the present invention are included in the scope of the rights of the present invention.

What is claimed is:

1. A chip substrate comprising:
   a conductive layer being stacked in a horizontal direction and constituting a chip substrate;
   an insulator being alternately stacked with the conductive layer in the horizontal direction and electrically separating the conductive layer; and
   a lens insert having: a depression reaching down to a predetermined depth from a specified area of an upper surface of the chip substrate overlapping with the insulator; and a predetermined number of sides on the upper surface wherein arcs reaching down to the predetermined depth from the specified area of the upper surface of the chip substrate are formed at regions where the arcs protrude outwardly from a region defined by where extended lines of the sides meet each other.

2. The chip substrate according to claim 1, further comprising a cavity reaching down to a predetermined depth from an inner area of the lens insert overlapping with the insulator.

3. The chip substrate according to claim 2, wherein the cavity has a downwardly narrowing shape wherein a size of a cross-section thereof becomes smaller as a depth of the cavity becomes deeper.

4. The chip substrate according to claim 1, wherein the lens insert further includes additional arcs protruding outwardly from the sides on the upper surface of the chip substrate.

5. The chip substrate according to claim 1, wherein the predetermined number is four, and the arcs are formed at the four regions where the sides are met with each other.

6. The chip substrate according to claim 1, further comprising an electrode marker at the upper surface of the chip substrate for marking an electrode for at least one of the conductive layers separated by the insulators.

7. The chip substrate according to claim 1, wherein the lens insert further has a slot reaching down to a predetermined depth in a surface contacting a lens when inserting the lens.

* * * * *